(12) United States Patent
Jelonnek et al.

(10) Patent No.: US 8,150,324 B2
(45) Date of Patent: Apr. 3, 2012

(54) METHOD AND SYSTEM FOR CLIPPING A BASEBAND INPUT SIGNAL

(75) Inventors: Bjoern Jelonnek, Ulm (DE); Gunter Wolff, Ulm (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 1417 days.

(21) Appl. No.: 11/502,446

(22) Filed: Aug. 11, 2006

(65) Prior Publication Data
US 2007/0036251 A1 Feb. 15, 2007

(30) Foreign Application Priority Data

Aug. 11, 2005 (DE) .......................... 10 2005 038 122

(51) Int. Cl.
*H04B 1/00* (2006.01)
(52) U.S. Cl. ........... 455/43; 375/147; 375/260; 375/297
(58) Field of Classification Search ...................... 455/43
See application file for complete search history.

(56) References Cited

U.S. PATENT DOCUMENTS

| 5,396,656 | A  | * | 3/1995  | Jasper et al. ................ 455/295 |
| 5,631,969 | A  | * | 5/1997  | Hanson ....................... 381/107 |
| 5,640,416 | A  | * | 6/1997  | Chalmers .................... 375/147 |
| 5,983,085 | A  | * | 11/1999 | Zamat et al. .............. 455/127.1 |
| 5,995,565 | A  | * | 11/1999 | Tong et al. ................... 375/346 |
| 6,141,372 | A  | * | 10/2000 | Chalmers .................... 375/147 |
| 6,748,029 | B1 | * | 6/2004  | Lee .............................. 375/326 |
| 7,170,952 | B2 | * | 1/2007  | Hunton ........................ 375/296 |
| 7,266,159 | B2 | * | 9/2007  | Vella-Coleiro ............... 375/296 |
| 7,362,819 | B2 | * | 4/2008  | Obernosterer et al. ........ 375/296 |
| 7,463,697 | B2 | * | 12/2008 | Maltsev et al. ............... 375/297 |
| 2003/0012292 | A1 | * | 1/2003 | Hunton ......................... 375/295 |
| 2004/0240574 | A1 | * | 12/2004 | Piirainen et al. ............. 375/260 |
| 2005/0058095 | A1 | * | 3/2005 | Sadri et al. .................... 370/329 |
| 2005/0195916 | A1 | * | 9/2005 | Anvari ........................... 375/295 |
| 2005/0281345 | A1 | * | 12/2005 | Obernosterer et al. ........ 375/260 |
| 2006/0067426 | A1 | * | 3/2006 | Maltsev et al. ............... 375/297 |
| 2006/0133532 | A1 | * | 6/2006 | Jensen et al. .................. 375/279 |
| 2006/0187114 | A1 | * | 8/2006 | Gibson et al. ................ 342/195 |
| 2007/0063769 | A1 |   | 3/2007 | Jelonnek |

FOREIGN PATENT DOCUMENTS

| DE | 103 20 420 | 12/2004 |
| GB | 2 408 861 | 6/2005 |
| WO | WO 2004/100482 A1 | 11/2004 |

\* cited by examiner

*Primary Examiner* — Duc Nguyen
*Assistant Examiner* — Ajibola Akinyemi
(74) *Attorney, Agent, or Firm* — Staas & Halsey LLP

(57) ABSTRACT

A method for clipping a baseband input signal filters the complex baseband input signal with a function $H_1$ for forming a filtered first signal. To form a clipped signal in the baseband the filtered first signal is multiplied by a scaling factor. By a signal analysis of the filtered first signal signal overshoots are predicted from which the scaling factor is determined for the baseband clipping. The filter function $H_1$ is calculated as the quotient from a frequency response $H_S$ of a transmission filter used one the one hand and from an error frequency response $H_F$ on the other hand, with the error frequency response $H_F$ being determined in such a way that the error spectrally shaped with $H_F$, which arises for the limitation of the baseband signal, a frequency-dependent tolerance is not exceeded. Subsequently the clipped signal is filtered with the error frequency response $H_F$ for forming a filtered second signal.

19 Claims, 7 Drawing Sheets

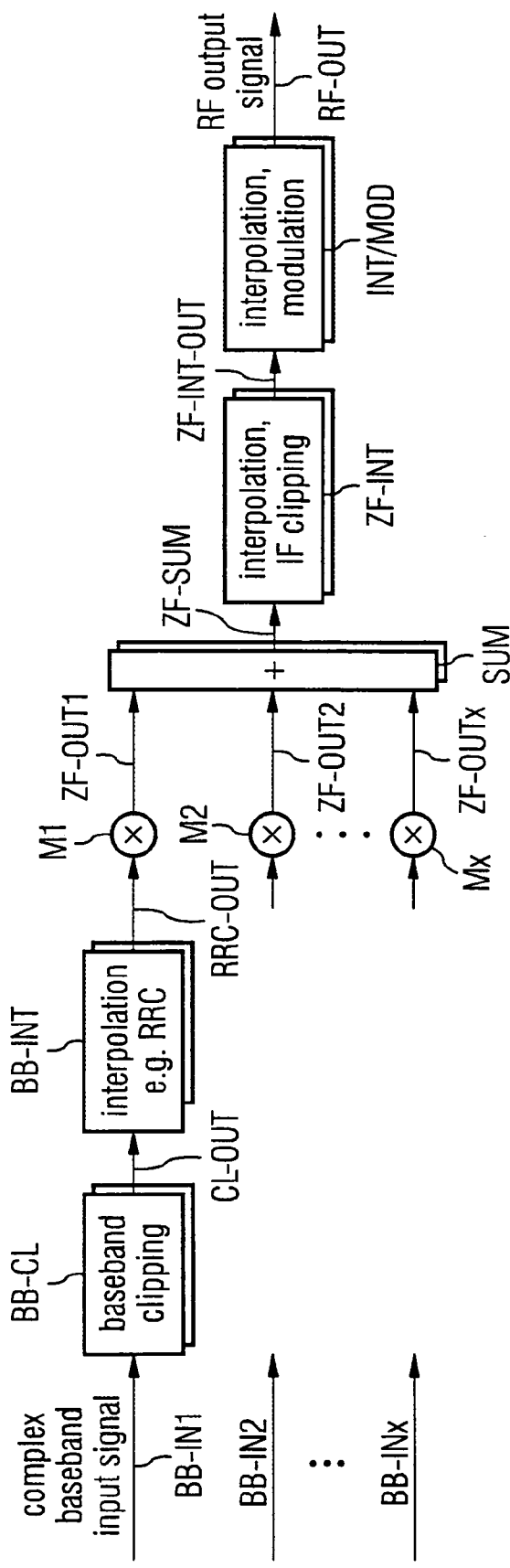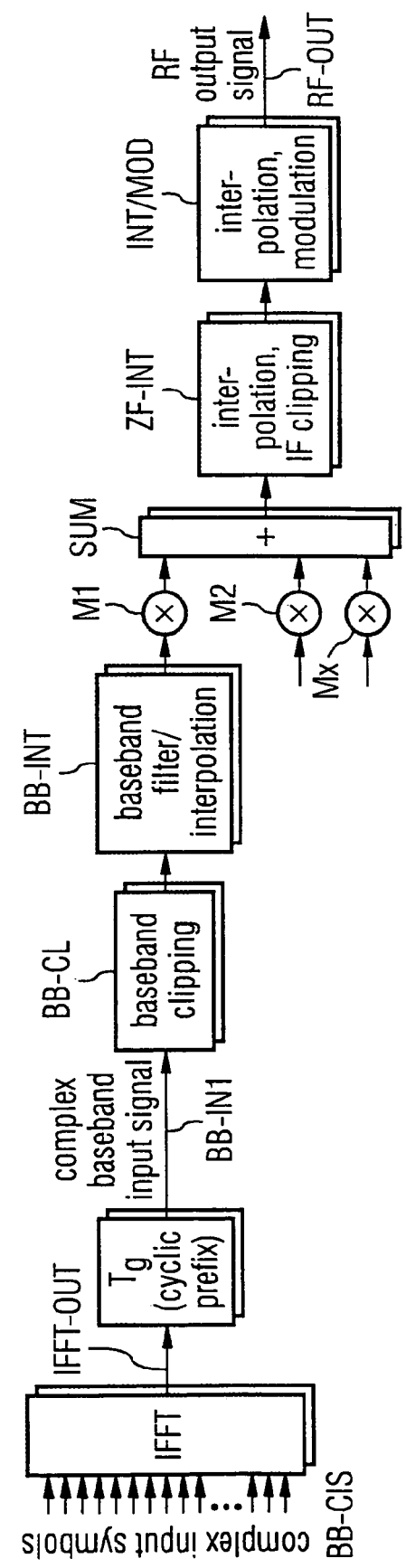

METHOD AND SYSTEM FOR CLIPPING A BASEBAND INPUT SIGNAL

CROSS REFERENCE TO RELATED APPLICATIONS

This application is based on and hereby claims priority to German Application No. 10 2005 038 122.7 filed on Aug. 11, 2005, the contents of which are hereby incorporated by reference.

BACKGROUND OF THE INVENTION

The invention relates to a method as well as to an arrangement for clipping a complex baseband input signal, especially baseband input signals of a multicarrier transmission system.

High-quality modulation methods are used with mobile communication systems, in which symbols with more than two possible information states are transmitted.

These modulation methods for example include the known modulation methods QPSK, 8 PSK and 16 QAM, in which, to obtain a higher data transmission rate, a constant envelope end of an instantaneous transmit power of a carrier-frequency transmission signal is dispensed with. This means that an instantaneous transmit power varies over time.

A variation of the instantaneous transmit power is also known in multicarrier transmission systems, in which signals for example are transmitted by OFDM radio transmission using subcarriers.

Depending on the modulation method used in each case and the combination of subcarriers used, an instantaneous maximum power of a transmit signal considered can lie far above an average value of the transmit power. The ratio of the maximum transmit power to average transmit power is referred to as the "peak to average ratio, PAR" or as the "peak to average power ratio, PAPR" whereby in the above case, the following applies: PAR>1 or PAPR >1.

With a PAR value of this type what is known as a control reserve is to be retained on the transmit amplifier side used, to avoid non-linear distortions of the transmit signal by the transmit amplifier. The need to do this increases the complexity and the power consumption of the transmit amplifier and simultaneously reduces efficiency of an overall transmission system considered.

Clipping methods are known with the aid of which the influence of a non-linear characteristic curve of the transmit amplifier on an amplified carrier-frequency transmit signal can to a certain extent be compensated for.

By applying such clipping methods it is possible to minimize the control reserve to be preserved on the transmit amplifier side.

FIG. 6 shows a formation of a high-frequency output signal to be transmitted RF-OUT a simplified diagram.

In this case a complex baseband input signal BB-IN1 is routed to a baseband clipping unit BB-CL. A clipped output signal CL-OUT formed in such a case is fed on the input side to an interpolation unit BB-INT. The interpolation unit BB-INT is for example embodied as a "Root Raised Cosine, RRC" filter and is used for bandwidth limitation.

An output signal RRC-OUT formed by the interpolation unit BB-INT is fed to a mixer M1 which samples the fed-in signal at a high sample rate and converts it into an intermediate frequency position ZF, so that an output signal ZF-OUT1 is formed. A frequency offset is formed by the mixer M1 in the output signal ZF-OUT1.

In the same manner further complex baseband input signals BB-IN2 to BB-INx are converted in further x−1 parallel branches into intermediate frequency signals ZF-OUT2 to ZF-OUTx.

Subsequently the intermediate frequency signals ZF-OUT1 to ZF-OUTx are overlaid additively in a summation unit SUM and combined into an intermediate frequency summation signal ZF-SUM.

The summation signal ZF-SUM is fed to a unit ZF-INT and there is both interpolated ("interpolation") and also fully clipped in the ZF position ("IF clipping"), so that an intermediate-frequency output signal ZF-INT-OUT is formed.

The output signal ZF-INT-OUT is fed to a unit INT/MOD which both interpolates it ("interpolation") and also converts it by modulation into a carrier frequency position RF so that a carrier frequency output signal RF-OUT is formed.

With the clipping method in the baseband by the base band clipping unit BB-CL, a clipped output signal CL-OUT is formed, which however because of the downstream RRC filter does not influence any frequency bands adjacent to the useful signal band.

With the clipping method in the intermediate frequency range ZF which is undertaken using the unit ZF-INT, maximum signal amplitudes which arise can cause additional faults in the adjacent frequency bands.

So that this does not produce any impermissible deterioration of the adjacent channel leakage ratio, ACLR, these faults must be suppressed in the adjacent frequency bands with the appropriate filters. these filters advantageously operate on the analog high-frequency signal.

With what is known as the "rectangular" clipping method inphase component and quadrature component of the complex signal are limited independently of each other.

With what is known as the "circular" clipping method an amount of a complex signal in the baseband does not exceed a predetermined maximum signal value.

FIG. 7 shows a known formation of a carrier-frequency output signal for a radio communication system with multicarriers in a simplified presentation.

An OFDM radio communication system is considered here for example. In this case complex baseband input signals BB-CIS are fed to a unit IFFT with the aid of which an inverse Fast Fourier transformation is performed.

The complex baseband input signals BB-CIS are transformed into a complex output signal IFFT-OUT. Subsequently guard times are inserted by the unit Tg and a complex baseband input signal BB-IN1 is formed. The guard times are inserted for suppression of the intersymbol interference between the symbols.

With reference to FIG. 6 a carrier-frequency output signal RF-OUT is then formed in the corresponding manner.

SUMMARY OF THE INVENTION

One possible object of the present invention, for a radio transmission in which subcarriers in particular are used, is to specify an arrangement and a method for clipping with which the ratio of maximum instantaneous power to average power (PAPR) of a complex digital baseband input signal can be reduced without impairing signal quality.

The method and apparatus described herein may make it possible to reduce a control reserve to be kept by an amplifier.

Through the method and apparatus it my be possible to reduce a required D/A converter resolution since the D/A converter no longer needs to present or resolve signal peaks.

With the aid of the method and apparatus it may be possible to limit transmit signals in the complex digital baseband in amplitude without having to accept disruptive adverse affects in respect of the transmit signal quality.

With the aid of the method and apparatus maximum transmit power values may be reduced, allowing a transmit power amplifier with a lower power consumption to be used.

As an alternative or in addition the average transmit power can also be increased. As a result of the increased average transmit power an increased range can also be obtained.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 6 shows the known formation of a high-frequency output signal to be transmitted described in the introductory description, FIG. 7 shows the known formation of a carrier-frequency output signal described in the introductory description for a radio communication system with multicarriers in a simplified diagram.

DETAILED DESCRIPTION OF THE PREFERRED EMBODIMENT

Figure 1:
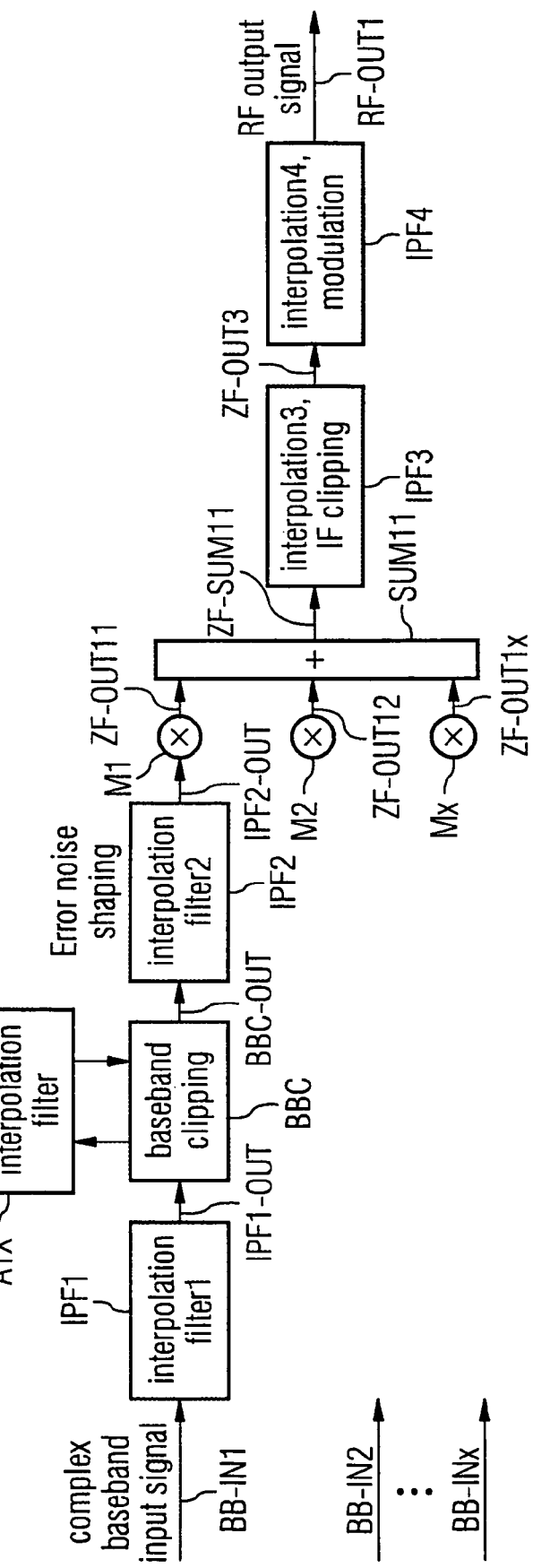
FIG. 1 shows formation of the carrier-frequency output signal in accordance with one potential embodiment of the present invention in a simplified diagram.

Reference will now be made in detail to the preferred embodiments of the present invention, examples of which are illustrated in the accompanying drawings, wherein like reference numerals refer to like elements throughout.

FIG. 1 shows a simplified diagram of the formation of the carrier-frequency output signal in accordance with the method and apparatus disclosed herein.

In this diagram a complex baseband input signal BB-IN1 is fed to a first interpolation filter IPF1. Its output signal IPF1-OUT is subsequently fed to a unit BBC which performs a clipping process in the baseband on the supplied signal IPF1-OUT.

A unit ATX is used in this clipping process which has a two-way connection to the unit BBC and is embodied as what is referred to as the "approximative TX and interpolation filter".

The threshold value overshoots of the signal predicted to arise in the baseband clipping process are evaluated with the aid of the ATX unit and are used for limitation of the signal An output signal BBC-OUT formed by the unit BBC is fed to an interpolation filter IPF2 with the aid of which "error noise shaping" is undertaken.

In summary both the supplied signal BBC-OUT and also the error arising on clipping in the unit BBC are shaped spectrally. This error would otherwise violate a permitted frequency mask since it is significantly more wideband than an expected useful signal. To avoid interference with other signals outside the useful band, the proportion outside the useful band must be removed by filtering. With the aid of the interpolation filter IPF2 the error is shaped spectrally and thus adapted to a tolerance in each multicarrier frequency range.

Both signal and also the signal deviations or errors are filtered.

An output signal IPF2-OUT formed by the unit IPF2 is fed to a mixer M1 and converted in an intermediate position ZF into a signal ZF-OUT11.

In the same way further complex baseband input signals BB-IN2 to BB-INx are converted in a total of x−1 parallel branches into intermediate frequency signals ZF-OUT12 to ZF-OUT1x.

Subsequently the intermediate frequency signals ZF-OUT11 to ZF-OUTx are overlaid additively in a summation unit SUM11 and combined into an intermediate frequency summation signal ZF-SUM11.

The summation signal ZF-SUM11 is fed to a unit IPF3 and both interpolated ("interpolation3") and also clipped there in the ZF slot ("IF clipping"), so that an intermediate-frequency output signal ZF-OUT3 is formed.

The output signal ZF-OUT3 is fed to a unit IPF4 which both interpolates it("interpolation4") and also converts it through modulation into a carrier-frequency position RF so that a carrier-frequency output signal RF-OUT1 is formed.

It is possible with the aid of the method and apparatus for the same noise level within the signal as is described for example by the "error vector magnitude, EVM" value to achieve a reduction of the "peak to average ratio, PAR".

It further may be possible to use as transmit power amplifiers low-cost amplifiers which do not exhibit a highly-linear characteristic amplifier curve over a larger range.

Complex, i.e. real and imaginary signal components, are converted simultaneously, whereby FIG. 1 features a further unit not described in any greater detail for each said unit.

In should be noted that many operations are executed with true complex numbers, in which the inphase component I and the quadrature component Q are related to each other.

Figure 2A:
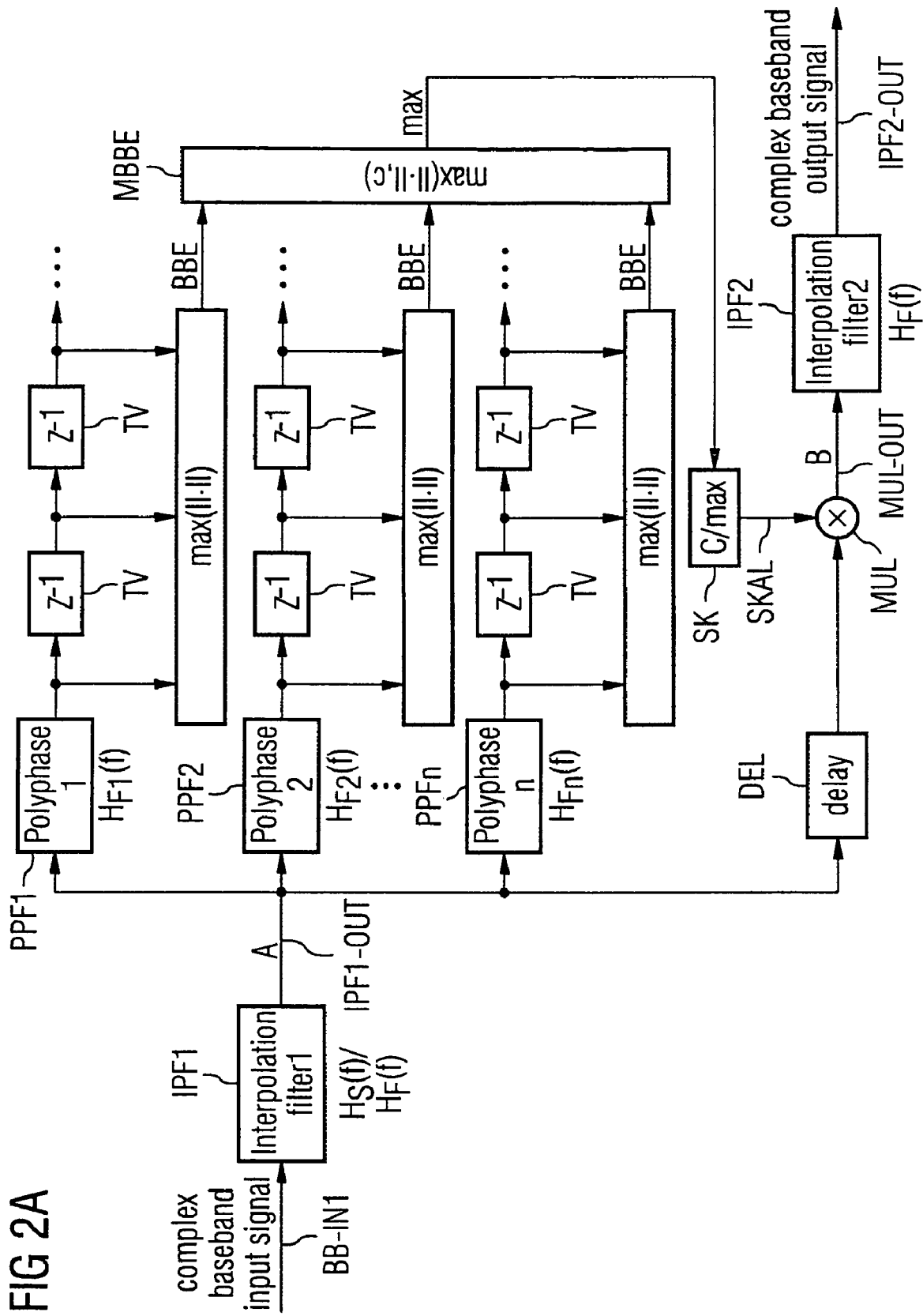
FIG. 2 is a more detailed diagram of the units shown in FIG. 1 for forming a complex baseband output signal, FIG. 3 with reference to FIG. 2, shows a cascade for forming a complex baseband output signal.

FIG. 2a shows a more detailed diagram of the units shown in FIG. 1 IPF1, BBC, ATX and IPF2 for forming the baseband complex output signal IPF2-OUT also shown in FIG. 1.

The unit IPF2 is embodied as an interpolation filter with a previously defined error frequency response $H_F(f)$ with which errors also occurring during clipping are filtered.

In determining the error frequency response $H_F(f)$ use is made of the fact that a greater error is tolerable outside the useful frequency range used than within the useful frequency range. In this case the error signal must simultaneously be attenuated so greatly outside the useful frequency range that interference which is impermissible in this range cannot occur.

For spectral shaping of the error an inverted frequency response of a distant-end receiver can be used taking into account the relevant band limits of the useful frequency range. The result is that the error in the distant-end receiver signal, after passing through a receive filter, is present evenly-distributed in the frequency spectrum.

As an alternative to this another frequency response can also be used. It should be ensured in all cases that no impermissible interference occurs outside the useful frequency range used.

The error frequency response $H_F(f)$ is advantageously used for the filter, which is made up of all the polyphase filters PPF1 to PPFn described below and is used in the unit IPF2.

The unit IPF1 has a frequency response $H_1(f)$ which is determined from a frequency response $H_S(f)$ of a transmit filter used and from a frequency response $H_F(f)$ as follows:

$$H_1(f)=H_S(f)/H_F(f)$$

The input signal BB-IN1 is provided by the unit IPF1 with the frequency response $H_1(f)$.

The output signal IPF1-OUT is transferred to a plurality of polyphase filters PPF1 to PPFn which each have respective frequency responses $H_{F1}(f)$ to $H_{Fn}(f)$.

In the polyphase filters PPF1 to PPFn there can additionally be an oversampling of the supplied signal IPF1-OUT with a factor K, which is advantageously selected with K=2.

Downstream from each of the polyphase filters PPF1 to PPFn are a plurality of units TV for timing delay and precisely one unit BBE for absolute value generation. This is used to generate a maximum of signal amounts within a time interval. The interval is produced in this case from the length of the delay chain or from the number of units TV.

The individual values which are supplied to the relevant unit BBE for absolute value generation, can also be weighted individually. In the example shown in FIG. 2 all the weighting factors $w_n = 1$ are selected equal.

However different weighting factors $w_n$ with $w_n \leq 1$ are also possible.

In an especially advantageous development an average weighting factor $w_n = 1$ is selected for all the delay chains.

Figure 2B:
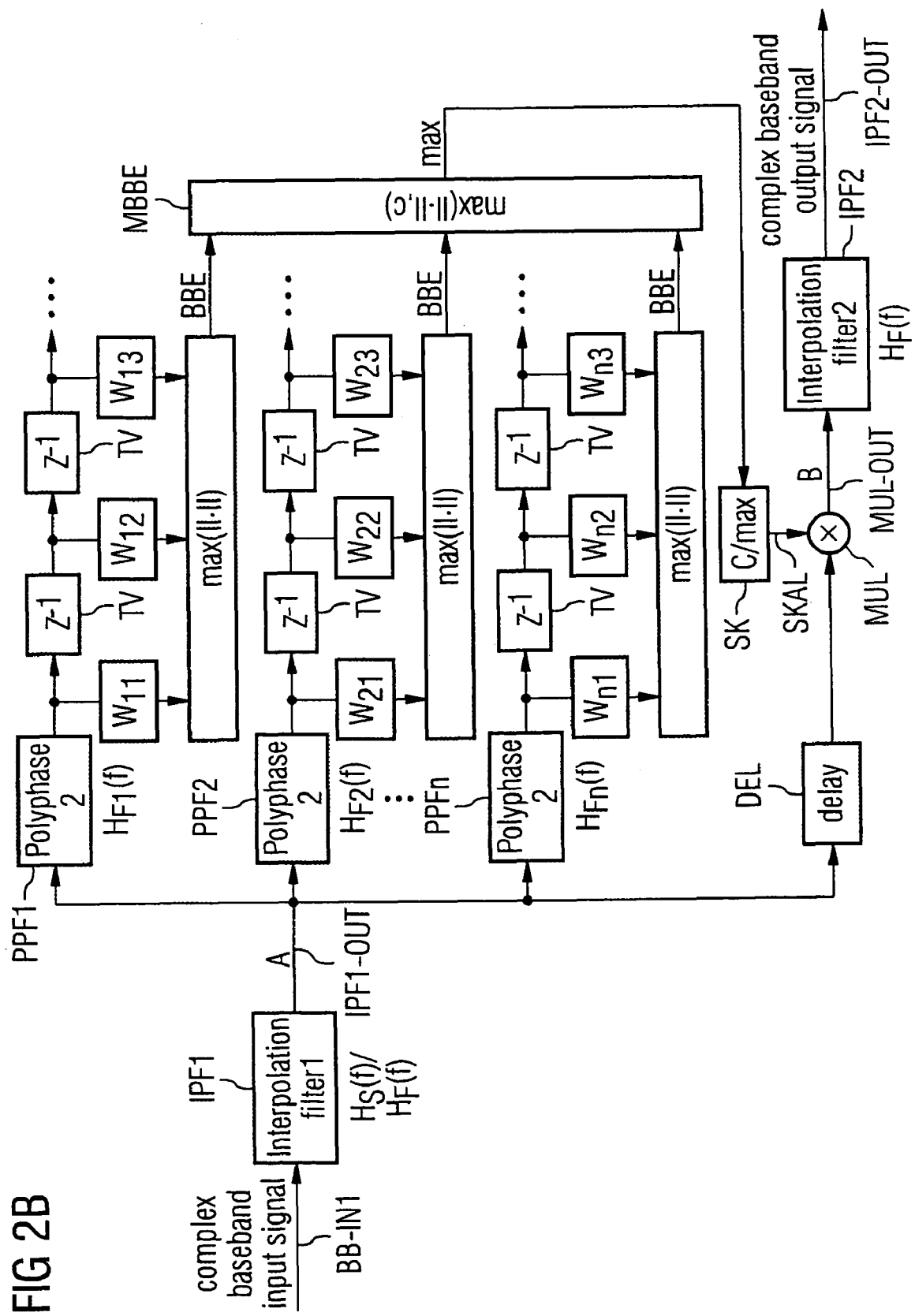

FIG. 2b, which is essentially identical to FIG. 2a, shows a typical weighting with weighting factors $w_{11}$, $w_{12}$, $w_{13}$, $w_{21}$, $w_{22}$, $w_{23}$, ..., $w_{n1}$, $w_{n2}$ and $w_{n3}$.

The individual units BBE for absolute value generation are in their turn connected on the output side to a unit MBBE for maximum value generation or for absolute maximum value generation, which determines a maximum max from the supplied values and from a value c, which forms a predetermined clipping threshold value.

This maximum max is fed to a unit SK for scaling which calculates a scaling factor SKAL=c/max.

The time-delayed signal IPF1-OUT delayed by a unit DEL is multiplied by the scaling factor SKAL in a unit MUL. In this case the unit DEL embodied as a delay element is used to equalize the time needed for the calculation of the scaling factor SKAL.

A scaled output signal MUL-OUT is formed by the unit MUL which is fed to the unit IPF2. The unit IPF2 in its turn also has the error frequency response $H_F(f)$ described above and is embodied as an interpolation filter. The signal IPF2-OUT is formed by the unit IPF2.

To summarize, the signal oversampled with the factor K and provided with the frequency response of the transmit filter $H_S(f)$ is present after each of the polyphase filters PPF1 to PPFn. The polyphase filters thus provide the option of predicting when and how strongly the predetermined clipping threshold value c will be exceeded.

From the intermediate value formed by the polyphase filters PPF1 to PPFn a sliding maximum value $M_{gB}$ is formed with the aid of the time delay element TV within an observed time interval.

If this maximum amount $M_{gB}$ is greater than a required present clipping threshold value c ("clipping level"), the delayed signal IPF1-OUT is attenuated with a factor=$C/M_{gB}$ with the aid of the unit SK. This means that in the immediate vicinity of the relevant peak value an adapted, attenuation weighted with $w_n$ is performed with the factor $C/M_{gB}$.

The unit IPF2 in this case simultaneously fulfills three functions. One is to adapt the sampling rate to the intermediate frequency. On the other hand the frequency response of the transmit signal with $H_2(f)=H_F(f)$ is corrected to a value $H_1(f)*H_2(f)=H_S(f)$.

With $H_1(f)=H_S(f)/H_F(f)$ and with $H_2(f)=H_F(f)$ it follows that:

$$H_1(f)*H_2(f)=H_S(f),$$

so that a signal spectrally shaped with the transmit filter is formed. Lastly an error in the useful frequency range with $H_2(f)=H_F(f)$ is spectrally shaped.

Figure 3:
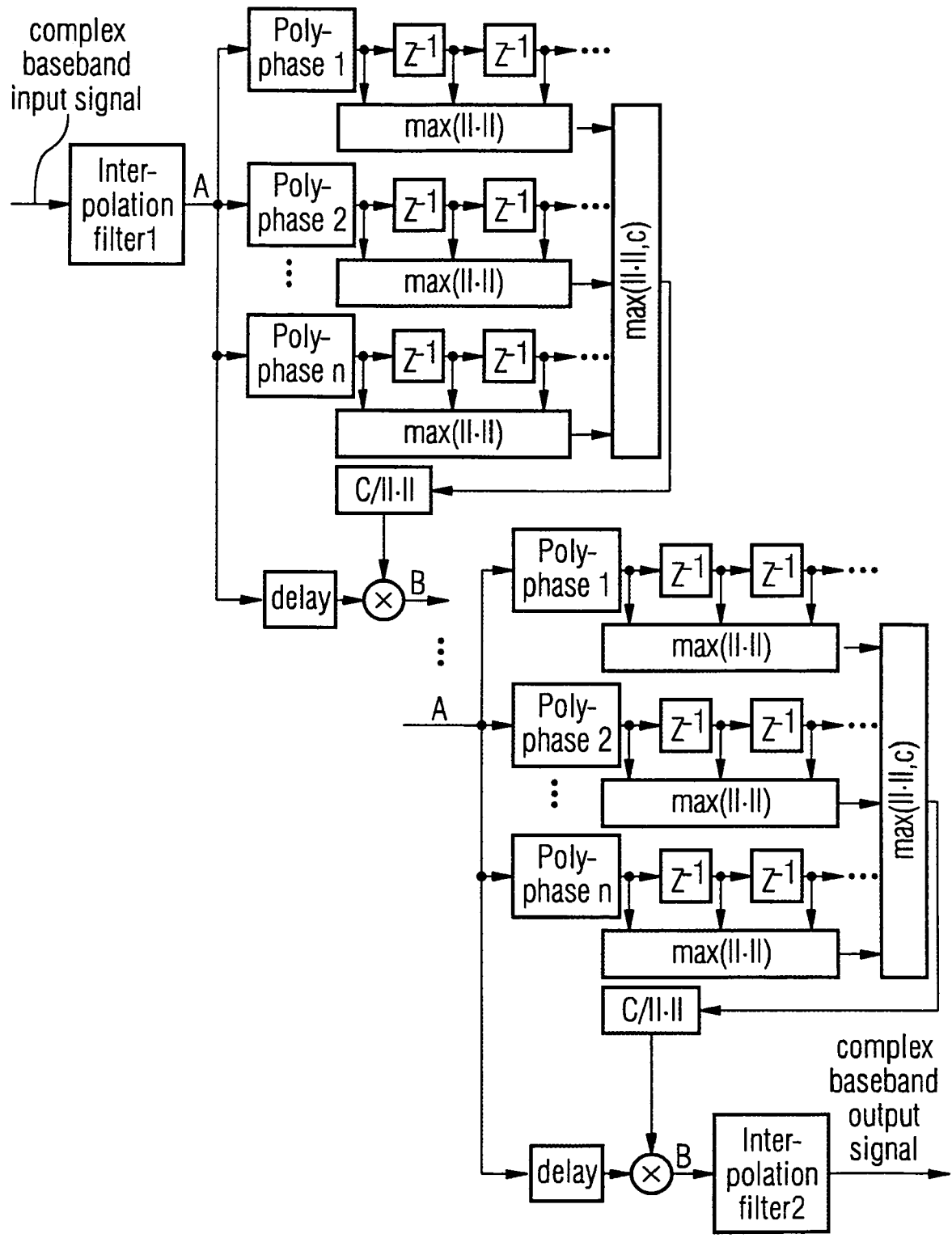

FIG. 3 refers to FIG. 2 and shows a cascade for forming a baseband complex output signal.

To this end, with reference to FIG. 2 the two units IPF1 and IPF2 are separated at points A and B. The remaining structure between the two units can be switched any number of times consecutively into a cascade.

For a dual cascade in particular—as shown here—an especially large improvement is produced as regards the additional outlay involved in the cascade in the PAPR ratio.

Since complex signals are involved, some of the steps are to be executed both with real signal components (inphase component, I component) as also with imaginary signal components (quadrature component, Q component).

Figure 4:
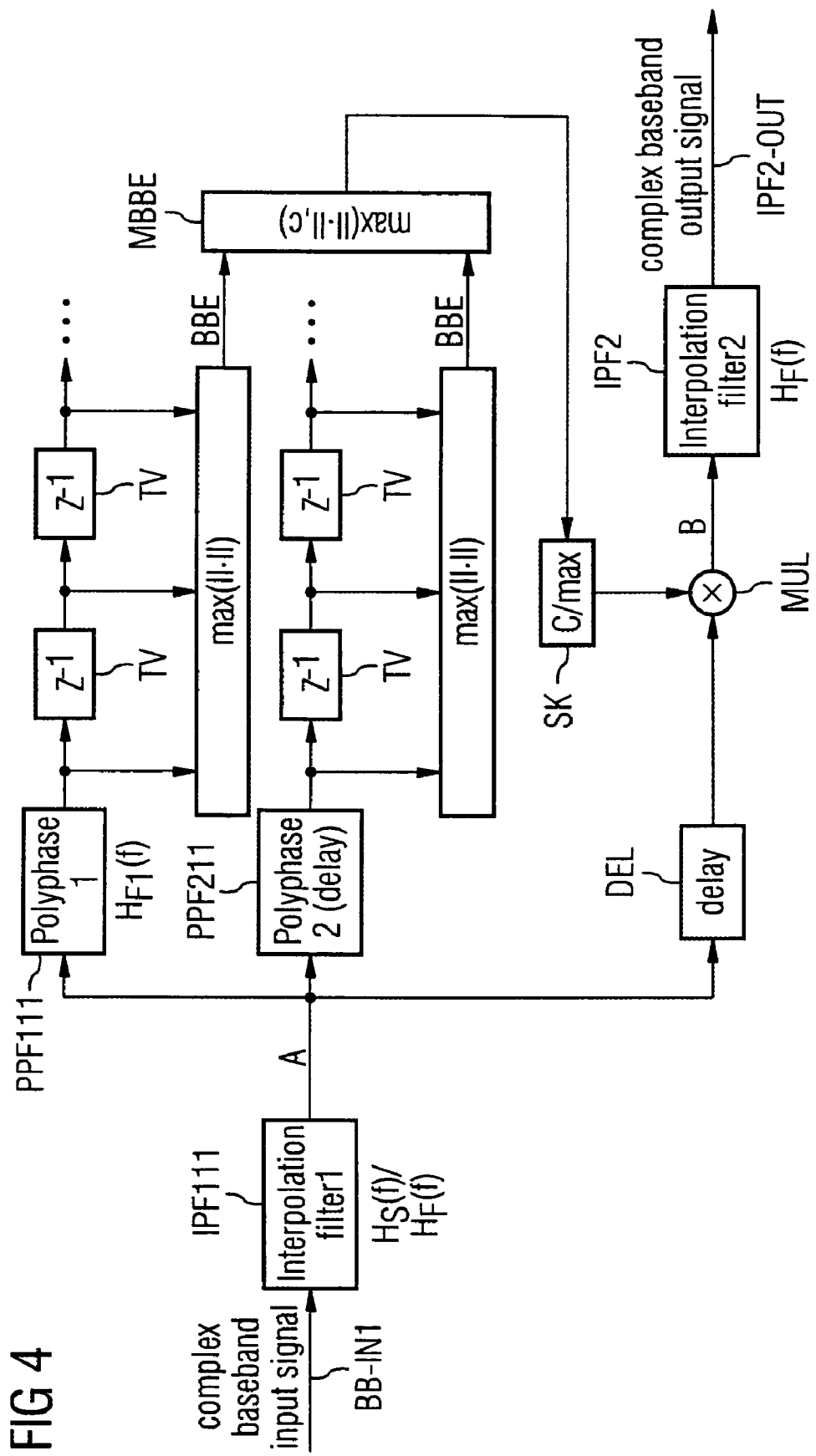
FIG. 4 shows a specific form of implementation of the more detailed diagram shown in FIG. 2.

FIG. 4 shows a specific form of implementation of the more detailed diagram shown in FIG. 2 in which only two polyphase filters PPF111 and PPF211 are used.

These polyphase filters are embodied as interpolation filters with predefined error frequency responses $H_F(f)$ with which an error even occurring during clipping is filtered.

FIG. 4 shows the simplified version if a halfband filter characteristic is selected for the error frequency response $H_F(f)$. This has the property that, with the exception of a single filter coefficient, namely of an average filter coefficient b1, every second coefficient has the value "0". The following are produced as filter coefficients for example:

a1 0 a2 0 a3 b1 a3 0 a2 0 a1.

This means that those filter coefficients which differ from "0" are allotted to a first polyphase filter PPF111. In the above-mentioned example these are the filter coefficients:

a1, a2, a3, a3, a2 a1.

Those filter coefficients for which the value is equal to "0" and the average filter coefficient is b1n are allotted to a second polyphase filter PPF211. This means that the second polyphase filter PPF211 degenerates into a pure delay function.

The fact that the polyphase filter PPF211 is embodied into a pure timer reduces the implementation effort. There merely remains a "true" polyphase filter PPF111, which supplies interpolated intermediate values corresponding to an oversampling with a factor=2.

As regards the function of the further units, the reader is referred to the description of FIG. 2.

With reference to FIG. 3, here too a cascading of the circuit section lying between the points A and B is possible.

Figure 5:
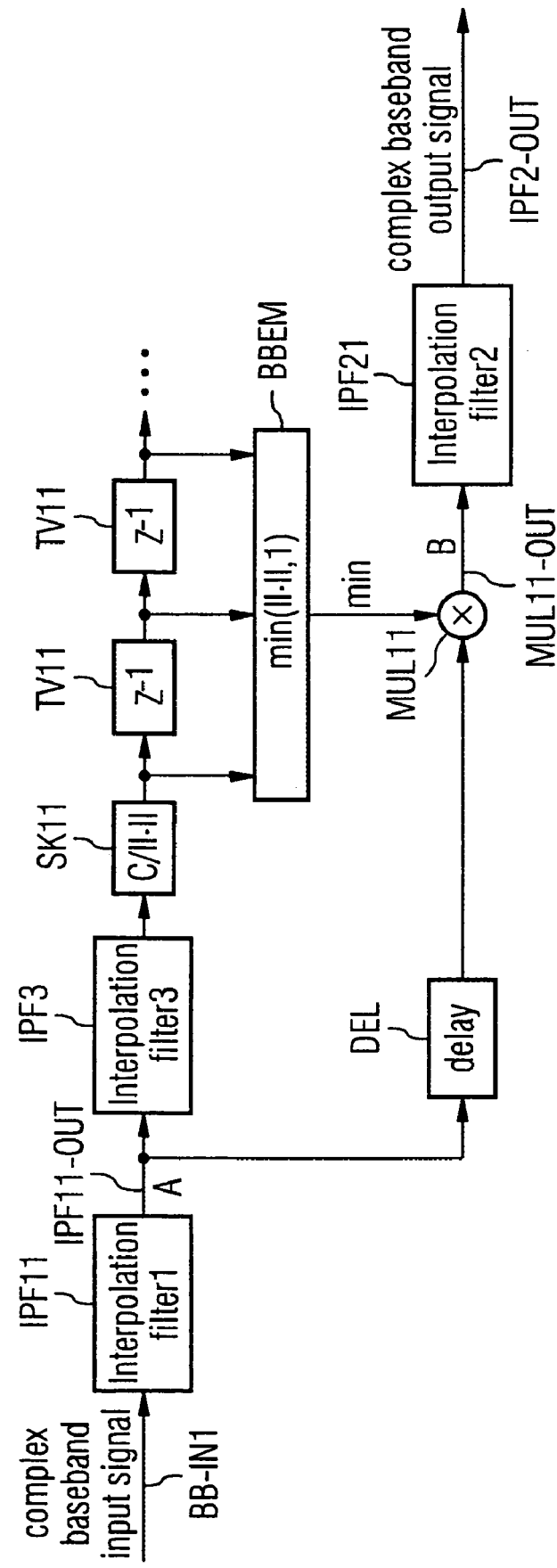
FIG. 5 shows formation of the carrier-frequency output signal in accordance with in an alternate embodiment of the present invention.

FIG. 5 shows formation of a carrier-frequency output signal in an alternative embodiment.

The unit IPF21 is embodied as an interpolation filter with previously defined error frequency response $H_F(f)$ with which an error arising during clipping can be filtered out. In determining the error frequency response $H_F(f)$ use is again made of the fact that a greater error is tolerable outside a useful frequency range used than within the useful frequency range. In this case the error signal outside the useful frequency range must simultaneously be attenuated strongly enough for no impermissible interference to occur.

For spectral shaping of the error an inverted frequency response of a distant-end receiver can be used, taking into account the relevant band limits of the useful frequency range. The result is that the error in the distant-end receiver signal, after passing a receive filter, is present evenly-distributed in the frequency spectrum.

As an alternative another frequency response can also be used, in which case it should also be ensured here that no impermissible interference occurs outside the useful frequency range used.

The unit IPF11 has a frequency response $H_1(f)$ which is defined by a frequency response $H_S(f)$ of a transmit filter used and from the frequency response $H_F(f)$ as follows:

$$H_1(f) = H_S(f)/H_F(f)$$

The input signal BB-IN1 is provided by the unit IPF1 with the frequency response $H_1(f)$ or filtered.

In addition an oversampling of the supplied signal BB-IN1 is also performed here.

Preview values for signal overshoots to be expected are determined by a unit embodied as an interpolation filter IPF3, whereby the unit IPF3 uses a frequency curve $H_F(f)$ for filtering.

Downstream from the unit IPF3 is a unit SK11 which calculates normalization factors within the framework of a provisional scaling. For each signal value fed to it a quotient is formed from the clipping threshold c on one hand and from the absolute value quadrate of the signal on the other hand.

Using two or more units TV11, which are used for delaying, and a unit BBEM, a minimum is formed from a value "1" and from a plurality of normalization factors to which different delayed signal values belong. This minimum is used as a scaling factor min and is fed to the unit MUL 11.

The unit MUL11 scales the output signal of the unit IPF11 delayed by the unit DEL by multiplying it by the scaling factor min.

The signal scaled in this way is then fed to a unit IPF21 embodied as an interpolation filter which filters it with the frequency response $H_F(f)$. If necessary a new oversampling is performed here in order to prepare a signal conversion in the intermediate frequency range. The signal IPF21-OUT is formed by the unit IPF2.

With reference to FIG. 3, here too a cascading of the circuit section lying between the points A and B is possible.

in an advantageous development an oversampling can occur in the interpolation filter IPF3 since the interpolation filters IPF3 and IPF21 are identical.

In this case a multiple of the clock frequency is also required for the interpolation filter IPF3.

In the polyphase filter embodiment shown in FIG. 2 the number of filter coefficients and processing operations is just as large, but at a lower clock frequency however. The polyphase filter embodiment thus represents an advantageous variant of FIG. 5.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method of clipping a baseband input signal, the method comprising: filtering a baseband input signal with a filter function Hi(f) to yield a filtered first signal; calculating a scaling factor, the scaling factor being derived from overshoots in magnitude of the filtered first signal over a threshold c; multiplying the filtered first signal by the scaling factor to yield a clipped signal; and filtering the clipped signal with an error frequency response HF(f) to yield a spectrally shaped clipped second signal wherein the method is executed in a multicarrier transmission system and a clipped second signal is formed from each baseband signal thereof, wherein each clipped second signal is converted by modulation into an intermediate frequency range, wherein the modulated intermediate-frequency signals are assembled into a summation signal to be clipped, and wherein the clipped summation signal is converted by modulation into a carrier-frequency output signal.

2. The method of claim 1, wherein an interpolation filter is used to yield the filtered first signal.

3. The method of claim 1, wherein an interpolation filter is used to yield the clipped second signal.

4. The method of claim 1, wherein at least two polyphase filters, which receive the filtered first signal, are used to predict signal deviations which arise in baseband clipping.

5. The method of claim 4, wherein output signals of the polyphase filters are weighted within an observation interval and maximum amounts are determined from weighted output signals from the polyphase filters.

6. The method of claim 5, wherein the scaling factor is determined from the maximum absolute values.

7. The method of claim 4, wherein maximum absolute values are determined as output signals of the polyphase filters within an observation interval.

8. The method of claim 1, wherein an interpolation filter which receives the filtered first signal is used to predict signal overshoots.

9. The method of claim 8, wherein the scaling factor is determined from an output signal of the interpolation filter.

10. An apparatus for clipping a baseband input signal, comprising: a first filter filtering the baseband input signal with a filter function Hi(f) to yield a filtered first signal; a prediction unit determining a scaling factor from overshoots in magnitude of the filtered first signal over a threshold c;

a baseband clipping device yielding a clipped signal by multiplying the filtered first signal, after the filtered first signal is delayed, with the scaling factor; and a second filter filtering the clipped signal with an error frequency response HE(f) to yield a spectrally shaped clipped second signal, wherein an output side of the first filter is connected to the baseband clipping device and the prediction unit, wherein an output side of the baseband clipping device is connected to the second filter, and wherein the filter function Hi(f) is determined as a quotient of a frequency response Hs(f) of a transmit filter and the error frequency response HF(f), the error frequency response HF(f) being determined such that the error spectrally shaped with HE(f), which arises during the limiting of the baseband signal, a frequency-dependent tolerance is not exceeded wherein the apparatus is in a multicarrier transmission system and a clipped second signal is assigned to each baseband signal, wherein each clipped second signal is delivered to a modulator input and used to yield a modulated intermediate frequency signal, wherein the modulated intermediate frequency signals reach a summation device which combines them into a summation signal, wherein the summation signal is delivered to an intermediate frequency clipping unit, and wherein the clipped summation signal is delivered to a modulator for forming a carrier-frequency output signal.

11. The apparatus of claim 10, wherein the first filter and/or the second filter is an interpolation filter.

12. The apparatus of claim 10, wherein the prediction unit includes, at least two polyphase filters which receive the filtered first signal.

13. The apparatus of claim 12, wherein an output side of each polyphase filter is respectively connected both directly and also via at least one delay element to an absolute value generation device such that, within an observation interval, a maximum absolute value is determined from output signals of the polyphase filters, with the observation interval being determined by the at least one delay element.

14. The apparatus of claim 13, wherein
output sides of the absolute value generation units respectively assigned to the polyphase filters are connected to a device for determining a maximum absolute value, so that from individual maximum absolute values a maximum value is determined, and
the scaling factor is determined by dividing the threshold c by the maximum value.

15. The apparatus of claim 12, wherein an output side of each polyphase filter is respectively connected both directly and also via at least one delay element to an assigned weighting unit and an output side of each weighting unit is respectively connected to an absolute value generation unit such that output signals of the polyphase filters are weighted within an observation period and a maximum value is determined from weighted signals, with the observation interval being determined by at least one delay element.

16. The apparatus of claim 10, wherein the prediction unit is an interpolation filter.

17. The apparatus of claim 16, wherein an output side of the prediction unit is connected to a scaling device, so that scaling factors will be formed from the signals of the interpolation filter by comparing them with a selectable clipping value (c).

18. The apparatus of claim 17, wherein the scaling device is connected both directly as also via at least one delay element to an absolute value generation device such that, within an observation interval a minimum value (min) is determined as the scaling factor from the scaling values, with the observation interval being defined by the at least one delay element.

19. The apparatus of claim 10,
wherein the prediction device and the baseband clipping unit are in a singly cascaded orientation,
wherein the filtered first signal is provided to the input of the cascade, and
wherein the clipped signal arrives at the second filter via the output of the cascade.

* * * * *

UNITED STATES PATENT AND TRADEMARK OFFICE
CERTIFICATE OF CORRECTION

PATENT NO. : 8,150,324 B2  Page 1 of 1
APPLICATION NO. : 11/502446
DATED : April 3, 2012
INVENTOR(S) : Bjoern Jelonnek et al.

It is certified that error appears in the above-identified patent and that said Letters Patent is hereby corrected as shown below:

Column 7, Line 62, In Claim 1, delete "Hi(f)" and insert -- $H_1(f)$ --, therefor.

Column 7, Line 67, In Claim 1, delete "HF(f)" and insert -- $H_F(f)$ --, therefor.

Column 8, Line 35, In Claim 10, delete "Hi(f)" and insert -- $H_1(f)$ --, therefor.

Column 8, Line 42, In Claim 10, delete "HE(f)" and insert -- $H_F(f)$ --, therefor.

Column 8, Line 48, In Claim 10, delete "Hi(f)" and insert -- $H_1(f)$ --, therefor.

Column 8, Line 49, In Claim 10, delete "Hs(f)" and insert -- $H_S(f)$ --, therefor.

Column 8, Line 50, In Claim 10, delete "HF(f)," and insert -- $H_F(f)$, --, therefor.

Column 8, Line 50, In Claim 10, delete "HF(f)" and insert -- $H_F(f)$ --, therefor.

Column 8, Line 52, In Claim 10, delete "HE(f)," and insert -- $H_F(f)$, --, therefor.

Signed and Sealed this
Twelfth Day of June, 2012

David J. Kappos
*Director of the United States Patent and Trademark Office*